United States Patent
Ranade et al.

(10) Patent No.: US 9,970,100 B2
(45) Date of Patent: May 15, 2018

(54) INTERLAYER COMPOSITE SUBSTRATES

(71) Applicant: THE BOEING COMPANY, Chicago, IL (US)

(72) Inventors: Alpana N. Ranade, Renton, WA (US); Marvi A. Matos, Seattle, WA (US); Arash Ghabchi, Seattle, WA (US)

(73) Assignee: The Boeing Company, Chicago, IL (US)

( * ) Notice: Subject to any disclaimer, the term of this patent is extended or adjusted under 35 U.S.C. 154(b) by 133 days.

(21) Appl. No.: 13/679,377

(22) Filed: Nov. 16, 2012

(65) Prior Publication Data

US 2014/0141264 A1    May 22, 2014

(51) Int. Cl.
| | | |
|---|---|---|
| *C23C 14/35* | (2006.01) | |
| *C23C 14/00* | (2006.01) | |
| *C23C 14/02* | (2006.01) | |
| *C23C 14/34* | (2006.01) | |
| *F01D 5/28* | (2006.01) | |
| *C23C 14/06* | (2006.01) | |

(52) U.S. Cl.
CPC .......... *C23C 14/35* (2013.01); *C23C 14/0084* (2013.01); *C23C 14/027* (2013.01); *C23C 14/06* (2013.01); *C23C 14/3492* (2013.01); *F01D 5/288* (2013.01)

(58) Field of Classification Search
CPC ... C23C 14/0084; C23C 14/027; C23C 14/06; C23C 28/34; C23C 28/42; C23C 14/0635; C23C 4/04; C23C 4/12; C23C 28/36; F01D 5/288; F01D 5/286; F03B 3/12

USPC ............. 428/446, 448, 698; 427/248.1, 569; 204/192.14
See application file for complete search history.

(56) References Cited

U.S. PATENT DOCUMENTS

| | | | |
|---|---|---|---|
| 4,414,085 A | | 11/1983 | Wickersham |
| 5,599,624 A | * | 2/1997 | Prochazka .......... C04B 35/6268 423/447.1 |
| 6,217,719 B1 | | 4/2001 | Kanazawa |
| 6,818,309 B1 | * | 11/2004 | Talpaert et al. ............... 428/432 |
| 2003/0215625 A1 | * | 11/2003 | Golecki ..................... 428/293.4 |
| 2004/0046497 A1 | | 3/2004 | Schaepkens et al. |
| 2005/0118504 A1 | | 6/2005 | Honda et al. |
| 2006/0202191 A1 | | 9/2006 | Gerlach et al. |

(Continued)

FOREIGN PATENT DOCUMENTS

| | | | |
|---|---|---|---|
| CN | 1966467 A | | 5/2007 |
| DE | 102008028540 | * | 12/2009 |

(Continued)

OTHER PUBLICATIONS

Plasma Therm, accessed online Jan. 18, 2017.*

(Continued)

*Primary Examiner* — Camie S Thompson
(74) *Attorney, Agent, or Firm* — Christopher J. Knors; Moore & Van Allen PLLC

(57) ABSTRACT

An interlayer configured for a composite substrate surface, the interlayer having a higher concentration of at least one first chemical element at the interface of the substrate surface and the innermost interlayer surface and a higher concentration of at least one second chemical element at the outermost interlayer surface is disclosed. Methods of forming the interlayer and providing functional properties to said composites are disclosed.

4 Claims, 2 Drawing Sheets

(56) References Cited

U.S. PATENT DOCUMENTS

| | | | |
|---|---|---|---|
| 2007/0052666 A1* | 3/2007 | Tanuma et al. | 345/107 |
| 2007/0054103 A1 | 3/2007 | Fareed et al. | |
| 2007/0128960 A1* | 6/2007 | Ghasemi Nejhad et al. | 442/59 |
| 2008/0056905 A1* | 3/2008 | Golecki | C23C 30/00 416/241 R |
| 2010/0239742 A1* | 9/2010 | Larson-Smith et al. | 427/8 |
| 2010/0239870 A1* | 9/2010 | Bowen | C09D 1/00 428/447 |
| 2012/0024380 A1 | 2/2012 | Feldman-Peabody | |
| 2013/0323481 A1* | 12/2013 | Gasworth | B32B 7/12 428/212 |

FOREIGN PATENT DOCUMENTS

| | | |
|---|---|---|
| GB | 1117009 A | 6/1968 |
| JP | 11-124693 A | 5/1999 |
| JP | 2003-512997 A | 4/2003 |
| JP | 2008-535794 A | 9/2008 |
| WO | 01/24250 A1 | 4/2001 |

OTHER PUBLICATIONS

European Patent Office, European Patent Application No. 13193328.5 Partial European Search Report dated Feb. 10, 2014, pp. 1-7.

Sturgeon, et al., "Cold Sprayed Coatings for Polymer Composite Substrates," Proc. of the 10th ISMSE & the 8th ICPMSE, Colliore, France, Jun. 2006, pp. 1-5.

Narayan, Roger J., "Adhesion Properties of functionally Gradient Diamond Composite Films on Medical and Tool Alloys," J. Adhesion Sci. Technol., vol. 18. No. 12, 2004, pp. 1339-1365.

Lugscheider et al., "Mechanical Properties of Thermal Sprayed Coatings on CFRP," Proceedings of the 5th National Thermal Spray Conference, Jun. 1993, pp. 569-573.

Lugscheider et al., "Thermal Sprayed Coatings for Carbon Reinforced Plastices—Research; Development and Applications," pp. 28-31.

Ivosevic, M., et al.; "Solid particle erosion resistance of thermally sprayed functionally graded coatings for polymer matrix composites," Surface & Coatings Technology, 2006, pp. 5145-5151, vol. 200.

European Patent Office; Extended European Search Report for European Patent Application No. 13193328.5 dated Jul. 16, 2014, 13 Pages.

Chinese Patent Office; Office Action for Chinese Patent Application No. 201310581232.6 dated Aug. 5, 2016, 16 Pages.

Japanese Patent Office; Office Action for Japanese Patent Application No. 2013-236290 dated Sep. 12, 2017, 6 Pages.

Chinese Patent Office; Office Action for Chinese Patent Application No. 201310581232.6 dated Aug. 22, 2017, 14 Pages.

Chinese Patent Office, Office Action for Chinese Patent Application No. 201310581232.6 dated Feb. 9, 2018, 17 Pages.

* cited by examiner

INTERLAYER COMPOSITE SUBSTRATES

TECHNICAL FIELD

This disclosure relates an interlayer configured for a composite substrate surface, the interlayer having a higher concentration of at least one first chemical element at the interface of the substrate surface and the innermost interlayer surface and a higher concentration of at least one second chemical element at the outermost interlayer surface. Methods of forming the interlayer and providing functional properties to said composites are disclosed.

BACKGROUND

Despite having high strength, carbon-carbon composites (e.g., carbon fiber reinforced polymers (CFRPs)) exhibit low wear resistance, low thermal and electrical conductivity that limit their use in demanding applications. In addition, the use of carbon-carbon composites in high temperature applications has been limited by the inherent problem of susceptibility to oxidation, among other drawbacks. To address the current deficiencies that are mainly related to surface characteristics of CFRPs different surface coatings can be applied. However, one of the main challenges in coating (e.g. thermal spray coating technology) the CFRP surface is the degradation of epoxy used in CFRPs. Many composite materials which contain a mixture of organic and inorganic material can be damaged or otherwise altered during coating processes. This is particularly true for high-energy/high temperature coating processes which otherwise would provide enhanced properties to the composite material. Thus, many composite materials cannot be used in more demanding applications.

To address the oxidation, the concept of functionally graded materials (FGMs) has been demonstrated. Thus, any surface coatings used for protection of CFRPs require to demonstrate good adhesion and improved functionality. One technique to achieve good adhesion as well as improved functionality is to grade the chemistry of coating material (FGM) in a way that exhibits good adhesion in first layer in contact with CFRP and improved functionality (e.g. wear resistance) in outermost layers. However, FGMs are often utilized as thin film coatings instead of bulk-FGMs, due to difficulty in controlling the gradient, and have been demonstrated mainly for metal substrates. Other limitations include poor adhesion of thermal spray coatings on such composites. Coating of different materials on such composites typically requires plasma treatment and/or etching, chemical and/or mechanical treatment of the surface, each of which has drawbacks and/or adds cost and processing time to finished articles.

SUMMARY

In one embodiment, a method for depositing an interlayer on a substrate surface is provided, comprising providing a substrate having a surface; and depositing an interlayer on the surface, the interlayer having a substrate-proximal layer comprising a first composition, and a surface-proximal layer comprising a second composition, the second composition having a chemical composition different from the first composition.

In one aspect, the interlayer has a varying chemical concentration gradient of at least one chemical element from the substrate-proximal layer to the surface-proximal layer.

In another aspect, alone or in combination, the concentration of the at least one chemical element is higher in the substrate-proximal layer than the surface-proximal layer.

In a further aspect, alone or in combination with any of the previous aspects, the method further comprises the step of adjusting the concentration of at least one of the chemical elements associated with the interlayer during the deposition step.

In a further aspect, alone or in combination with any of the previous aspects, the at least one chemical element is one or more of carbon, oxygen, nitrogen, sulfur, or halogen.

In a further aspect, alone or in combination with any of the previous aspects, the at least one chemical element is carbon and oxygen.

In a further aspect, alone or in combination with any of the previous aspects, the interlayer is substantially silicon oxycarbide.

In a further aspect, alone or in combination with any of the previous aspects, the substrate is a composite material.

In a further aspect, alone or in combination with any of the previous aspects, the composite material is a fiber reinforced polymer.

In a further aspect, alone or in combination with any of the previous aspects, the composite material is a carbon fiber reinforced polymer.

In a second embodiment, an interlayer configured for deposition on a composite polymer substrate surface is provided, having: a substrate-proximal layer having a first chemical composition of at least one chemical element or molecule; and a surface-proximal layer comprising a second chemical composition having more or less of the at least one chemical element or molecule than that of the substrate-proximal layer.

In one aspect, the substrate-proximal layer has a higher concentration of the at least one chemical element than the surface-proximal layer.

In another aspect, alone or in combination, the at least one chemical element is one or more of carbon, oxygen, nitrogen, sulfur, or halogen.

In another aspect, alone or in combination with any of the previous aspects, the at least one chemical element is carbon and oxygen.

In another aspect, alone or in combination with any of the previous aspects, the concentration of carbon and oxygen continuously decreases from the substrate-proximal layer to the surface-proximal layer.

In a further aspect, alone or in combination with any of the previous aspects, the interlayer consists essentially of silicon, carbon, and oxygen.

In a further aspect, alone or in combination with any of the previous aspects, the interlayer is substantially silicon-oxycarbide.

In a further embodiment, a method for protecting a surface of a composite substrate during kinetic energy coating and/or high temperature coating is provided. The method comprising: depositing an interlayer of substantially silicon oxy-carbide, the interlayer having a substrate-proximal layer and a surface-proximal layer, the interlayer having a concentration gradient of carbon and oxygen associated with the silicon oxy-carbide from the substrate-proximal layer and the surface-proximal layer; and at least partially protecting to the composite substrate surface during kinetic energy coating and/or high temperature coating.

In one aspect, the interlayer is deposited by chemical and/or physical vapor phase deposition.

In another aspect, alone or in combination, the depositing step is plasma-enhanced vapor phase deposition.

In a further aspect, alone or in combination with any of the previous aspects, the plasma-enhanced vapor phase deposition technique is radio frequency (RF) magnetron sputtering or chemical vapor deposition.

In a further embodiment, an organic polymer fiber-reinforced composite component is provided, the component comprising: a composite substrate having a surface; and an interlayer on the surface, the interlayer comprising a substrate-proximal layer and a surface-proximal layer, the interlayer comprising a concentration gradient of at least one chemical element, the at least one chemical element concentration being higher at the substrate-proximal layer than at the surface-proximal layer.

In a further embodiment, a vehicle is provided comprising: at least one component comprising an organic polymer fiber reinforced composite surface; and an interlayer comprising substantially silicon oxy-carbide present on the composite surface, the interlayer comprising a substrate-proximal layer and a surface-proximal layer, the interlayer comprising a concentration gradient of at least carbon and oxygen, the carbon concentration being higher at the substrate-proximal layer than at the surface-proximal layer.

DETAILED DESCRIPTION

Figure 1:
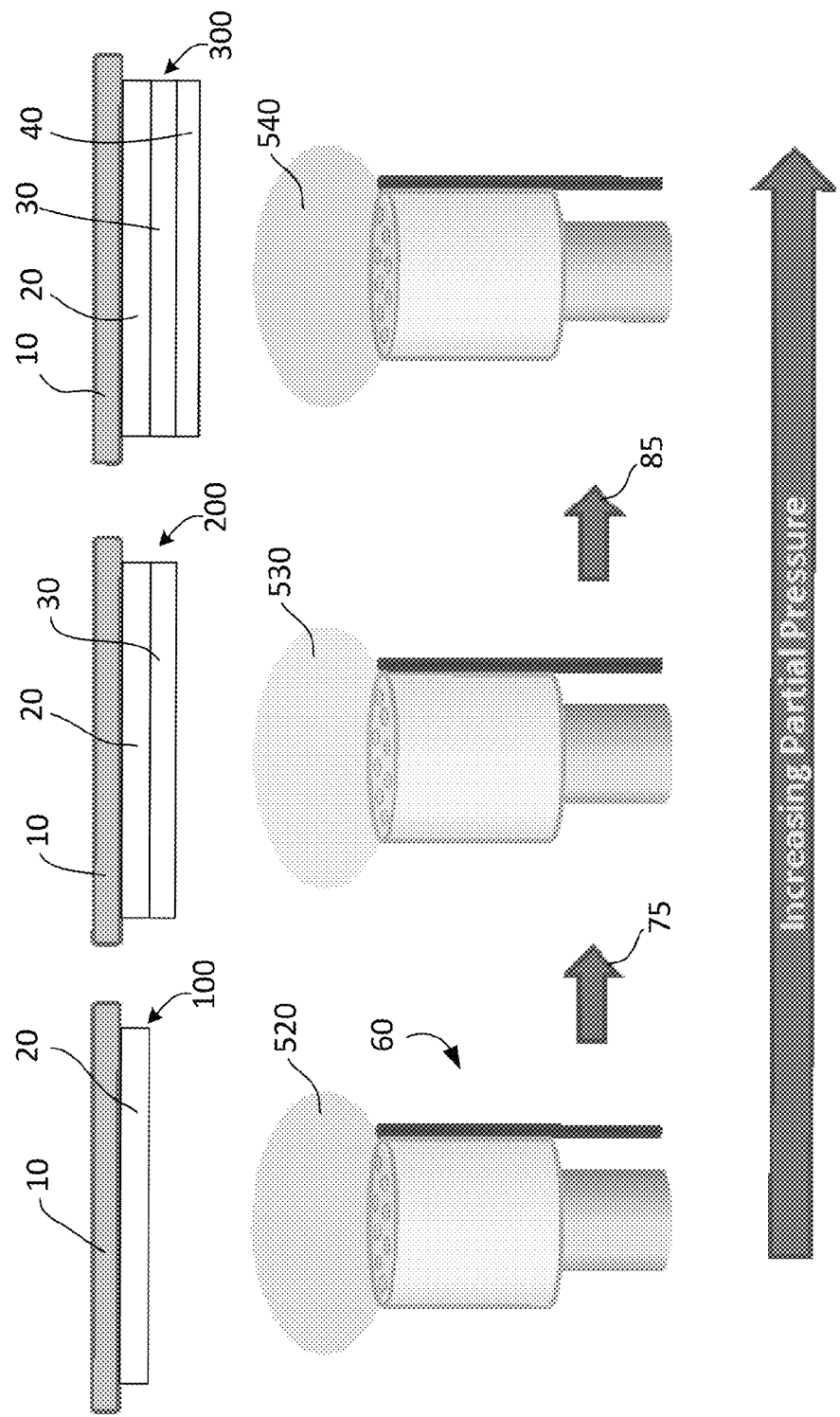
FIG. 1 depicts an exemplary interlayer deposition method embodiment as disclosed and described herein.

It is a current technical challenge to provide adhesion of interlayers, or adhesion layers, or barrier layers on organic composite polymers. Many polymer composites include organic matrices that require protection in subsequent coating processes. "Protection" as used herein in the context of organic composite material includes without limitation, reduced or eliminated chemical or physical changes to the composite matrix (organic and/or inorganic components) during or subsequent to the one or more coating processes. Moreover, many such polymers do not readily accept coating layers due to differences in the chemical compositions of the composite matrix and the material being coated. There is a need therefore to provide interlayers, adhesion layers, or barrier layers for organic composite polymers that are robust, and readily accept additional coatings such that the organic composite materials can be used in more demanding applications.

Such polymer composites can include engineering resins in combination with organic and/or inorganic reinforcement fiber. An example of a class of engineering resin in combination with reinforcement fiber is carbon fiber reinforced polymers (CFRPs) can be used. Other reinforced polymers can be used. For example engineering plastics can include for example, ultrahigh molecular weight polyethylene, nylon 6, nylon 66, polytetrafluoroethylene, acrylonitrile butadiene styrene, polycarbonates, polyamides, polybutylene terephthalate, polyethylene terephthalate, polyphenylene oxide, polysulfone, polyether ketone, polyether ether ketone, polyamides, polyphenylene sulfide, polyoxymethylene, cyclic olefinic copolymers (COC's), and blends thereof. Other engineering polymers, resins, thermal sets, plastics, and blends thereof can be used in accordance with the methods disclosed and described herein. Exemplary composites include the above engineering resins in combination with carbon nanotubes, glass fibers, Kevlar fibers, ceramic fibers, carbon fibers, or combinations thereof. The present disclosure addresses numerous deficiencies of conventional composite coating processes and coated composites made therefrom.

The present disclosure describes deposition of well adhered thin films (hereinafter also referred to as an "interlayer") on the surface of substrates of organic polymer composites. The deposition technique and interlayer structural design disclosed allow achieving improved adhesion of coatings to substrate and providing additional surface functionality for the composite and to receive subsequent coatings, for example, highly kinetically and/or high temperature coating techniques and the coatings provided therefrom. These improved performance and functionalities of the composite and their use with such high energy/temperature spray coatings are achieved by controlling and/or modulating of chemistry of the interlayer material throughout its vertical thickness. "Vertical thickness" refers generally to the height measured substantially perpendicular to the plane or longitudinal axis of the substrate surface (or a point thereon). Typically the vertical thickness of the interlayer is in microns, however, in certain aspects, submicron or thinner or millimeter or thicker thicknesses can be employed.

The interlayer structure generally has a "bottom" layer (adjacent to composite substrate surface) with a chemical composition that is configured for compatibility with the composite material surface. For the aid of describing the interlayer, the interlayer can be referred to as having a "substrate-proximal layer" and a "surface-proximal layer" corresponding to the interface of the interlayer at the substrate surface, and the interface outermost surface, respectively. The interlayer, alone or in combination with a subsequent coating, can transform the chemical, electrical and mechanical presentation of the composite, allowing a greater range of applications. The presently disclosed process can be used on metal or plastic substrates and in combination with other thin film materials and thin-film coating methods. In one aspect, the interlayer can be used to protect a substrate during high energy/high temperature coating, thus allowing for at least a portion of the substrate to be coated with high energy/high temperature coatings with improved protection for the composite.

In one aspect, the present disclosure applies an interlayer with specific chemical composition on the surface of the composite. In other aspects, the present disclosure provides creating a concentration gradient within the interlayer where there is a first concentration of a first chemical element (e.g., oxygen, carbon, nitrogen, etc.) at the interface between the innermost layer of the interlayer substrate (e.g., the substrate-proximal layer of the composite material), and a second concentration of a second (different) chemical element (e.g., oxygen, carbon, nitrogen, etc.) content toward the outermost layer of the interlayer (surface-proximal layer) so as to provide improved adhesion between the substrate (composite) and the interlayer and/or improved adhesion of subsequent coatings. In certain aspects, the interlayer is configured such that the second concentration of the second chemical element is greater than the first concentration of the first chemical element at the surface-proximal layer. In yet another aspect, the interlayer is a series of layers, e.g. a laminate, having a variable chemical composition through at least a portion of the vertical thickness of the interlayer. The laminate-interlayer can be prepared in a single deposition process or by a sequence of depositions in one or more deposition apparatuses.

In a specific application of the presently disclosed method, controlling the partial pressure of a reactive gaseous species (e.g., oxygen) provides control of the chemical composition of the final interlayer and its mechanical properties. In one aspect, no etching, chemical or mechanical surface treatment is required after deposition of the presently disclosed interlayer to manipulate the chemical gradient. In another aspect, etching, chemical, argon bombardment, and/or mechanical surface treatment may be used to modify or alter the interlayer surface properties, which may include its chemical composition, surface roughness, and/or hydrophobicity and hydrophilicity. In another aspect, the interlayer comprises a laminate of layers each layer independently deposited with the same or different chemical composition and/or chemical distribution throughout the vertical thickness of the interlayer.

In one aspect, the interlayer comprises the elements of silicon, oxygen, and carbon. In another aspect, the interlayer consists essentially of silicon, oxygen, and carbon. Control of chemical content and the content of reactive species throughout the thickness of the interlayer provides improved adhesion to the composite material as well as improved adhesion to subsequent coatings. In one embodiment, the interlayer comprises sputtered silicon oxy-carbide.

Methods of Depositing Interlayer

The interlayer may be deposited using a number of deposition techniques. Such techniques include sputtering, chemical vapor deposition, and plasma deposition. Other processes may be used or combined. By way of example, in one aspect, a silicon oxy-carbide film is deposited by magnetron sputtering a silicon carbide target in the presence of oxygen and an inert gas that provides a method of preparing and depositing a single and/or multilayer interlayer structures. In one aspect, the oxygen partial pressure is controlled during the magnetron sputtering of the silicon carbide target. Thus, in one example, at the beginning of the interlayer deposition process, the oxygen partial pressure is very low or zero and transitions to an increasing amount of oxygen partial pressure over the duration of the interlayer deposition process. In one aspect, the oxygen partial pressure is modified during the interlayer deposition process in a gradient manner. In another example, the oxygen partial pressure is modified in a step-like, increasing manner during the deposition process. In yet another example, the oxygen partial pressure is modified in a two-step process to provide essentially a dual-layer structure of low/high oxygen content (or high/low carbon content) at the substrate-proximal layer and surface-proximal layer, respectively. One or more of the above-mentioned processes can be repeated one or more times to provide a layered or laminate like interlayer of the same or different gradient structure.

In another aspect, oxygen can be replaced or combined with one or more gases including for example, nitrogen, ammonia, hydrogen sulfide, halogen, halocarbons. Thus, for example, nitrogen or ammonia can be used to provide nitride surface functionality of the composite surface layer. Other chemical functionality can be provided by the selection of the gases used.

In another aspect, the interlayer film can comprises ternary silicon oxygen carbide amorphous thin films prepared by sputter deposition. The sputtering may be performed without direct heating of the substrate. In one aspect, a magnetron-plasma-enhanced chemical vapor deposition (magPECVD) technique can be used to provide the interlayer.

With reference to FIG. 1, an illustration, depicting in a general sense, an embodiment of an interlayer deposition method is provided, which exemplifies an RF magnetron sputtering process. Thus, FIG. 1 depicts at a first time interval substrate 10, for example, a composite polymer substrate, having deposited thereon, an interlayer is formed from RF sputtering unit 60 having a first partial pressure of a reactive gas 520 (e.g., oxygen) resulting in interlayer 100 having a first chemical composition 20. After a second time interval indicated by first arrow 75, reactive gas 530 having a partial pressure higher than that of reactive gas 520 provides gradient interlayer 200 having a second chemical composition 30 different from the first chemical composition 20. At this point the process can be terminated. Alternatively or optionally, after a time interval, indicated by arrow 85, reactive gas 540 having a partial pressure higher than that of reactive gas 530 provides interlayer 300 having a third chemical composition 40 different from the second chemical composition 30. The deposition process illustrated in FIG. 1 can be employed with other reactive gases such as nitrogen, halogens, hydrogen sulfide, etc. Combinations and/or metering of different reactive gases can be used. Combinations and/or metering of different reactive gases with one or more sputtering targets can be used. The presently disclosed process may be configured for an inline-process implementation.

Figure 2:
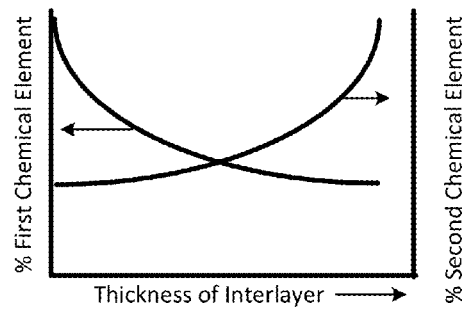
FIG. 2 illustrates an embodiment of an interlayer composition gradient as disclosed and described herein.
Figure 3:
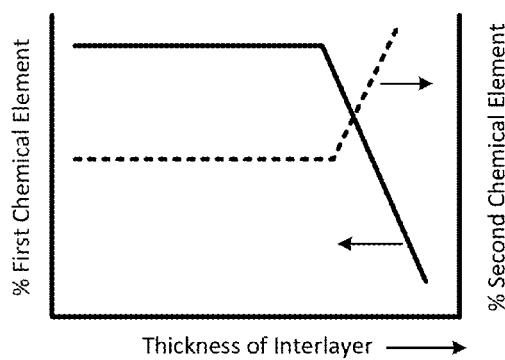
FIG. 3 illustrates an alternative embodiment of an interlayer composition gradient as disclosed and described herein.
Figure 4:
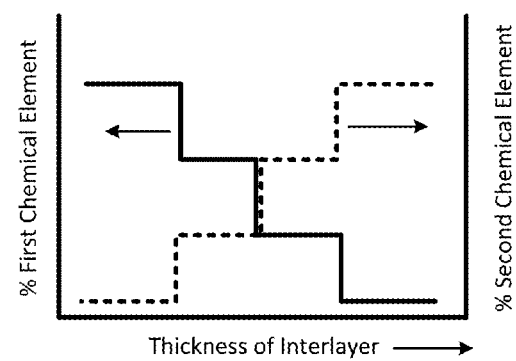
FIG. 4 illustrates an alternative embodiment of an interlayer composition gradient as disclosed and described herein.
Figure 5:
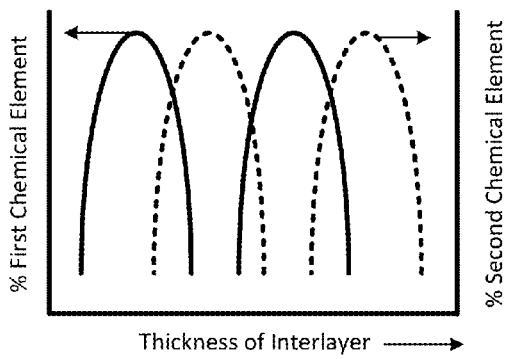
FIG. 5 illustrates an alternative embodiment of an interlayer composition gradient as disclosed and described herein.

FIG. 2 illustrates a chemical gradient embodiment of the interlayer as disclosed and described herein. The chemical gradient can be formed from in a single layer or by a series of layers (e.g., laminate). Thus, percent of first chemical element decreases as the thickness of the interlayer increases from the substrate-proximal layer, while the percent of second chemical element increases as the thickness of the interlayer increases from the substrate proximal surface (nearest surface-proximal layer). FIG. 3 illustrates an alternate embodiment of the chemical gradient of the interlayer as disclosed and described herein. In FIG. 3, the interlayer is essentially composed of two layers, the first layer having a percent of the first chemical element decreasing as the thickness of the interlayer increases from the substrate-proximal layer while the percent of the second chemical element increases. FIG. 4 illustrates yet another embodiment of a chemical gradient interlayer as disclosed and described herein. Thus, FIG. 4 shows a step change in the percent of first chemical element, which decreases as the thickness of the interlayer increases from the substrate-proximal layer while the percent of the second chemical element increases. FIG. 5 illustrates yet another embodiment of the chemical gradient interlayer as disclosed and described herein, wherein the percent of the first chemical element increases and then decreases along a predetermined thickness of the interlayer while concurrently the percent of the second chemical element decreases and then increases throughout and overlapping predetermined thickness of the interlayer. The relationship between the first and the second chemical composition is repeated one or more times throughout the interlayer thickness. Other combinations and structural arrangements of the first and the second chemical composition can be employed. Additional chemical compositions (e.g., third, fourth, etc.) can be used.

EXPERIMENTAL

By way of an exemplary example, a method of depositing an interlayer on a composite substrate is provided as follows. Using a silicon carbide target and an RF magnetron sputtering source, an interlayer having a substrate-proximal layer is produced in an atmosphere (at $10^{-3}$ Torr vacuum) under partial pressures of oxygen (zero to low $0.1 \times 10^{-3}$ Torr to an upper value of $1.5 \times 10^{-3}$ Torr when the total pressure (inert gas plus oxygen is $10 \times 10^{-3}$ Torr) using a power/target area of 5 W/cm² is deposited on a carbon fiber reinforced polymer (CFRP) substrate. Argon carrier/backflow gas was used, with a presputtering of 10 minutes. RF power was set at 100 W with 0.5 W of reflected power.

The substrate-proximal layer produced had a high carbon content, making it more compatible with the CFRP composite and an oxygen-rich surface-proximal composition, providing improved adhesion properties for subsequent coatings. Carbon and/or oxygen content (and other elemental compositional parameters) of the substrate-proximal layer (and/or surface-proximal layer) can be determined experimentally, for example, by interrupting or terminating the deposition and using XPS, Auger, or SEM-EDX analysis methods. The starting low concentration of oxygen can be chosen depending on the nature of the substrate. For example, for substrates having a high relative concentration of carbon, a substantially zero partial pressure of oxygen during silicon carbide deposition can be used so as to increase compatibility with the substrate and/or subsequent coatings. In a step-by-step or continuous fashion, the oxygen concentration is gradually increased during deposition, e.g., from zero to about 10%. The increase in partial pressure during deposition increases the oxygen relative content in the film. If a step-by-step change in oxygen concentration is used, a multi-layer interlayer layer can be prepared. If the oxygen concentration is continuously changed, then a gradual change in interlayer layer chemistry would result. The top or surface-proximal layer can be deposited in the presence of a higher oxygen concentration used for the substrate-proximal layer, e.g., higher than 10%. The surface-proximal interlayer thus formed can provide glassier, harder, and more scratch resistant film or coating on the substrate. After the interlayer has been deposited it can protect the composite material during a subsequent thermal spray coating process, which can be based or alternate high temperature/high velocity technique so as to transform the surface electrical, mechanical and/or thermal properties of the composite material. In another aspect, nitrogen or ammonia is used instead of oxygen to provide an interlayer with a different gradient of chemical and/or functional composition and properties. Likewise, sulfur or hydrogen sulfide can be used as the interlayer precursor material using a similar process. Oxygen, nitrogen and sulfur can be used in combination to form the interlayer. An interlayer of oxygen, nitrogen and/or sulfur would generally result in a surface that is polar and/or hydrophilic. Substituting and/or combining oxygen, nitrogen and/or sulfur with halogen (e.g., fluorine, chlorine, and/or bromine) can provide a relatively non-polar and/or hydrophobic surface that may contain one or more of amino, nitride, sulfide, hydroxy, and/or carboxyl functional groups. TABLE 1 provides the experimental parameters for ten samples prepared.

TABLE 1

Experimental Conditions for preparing exemplary interlayer on composite substrates

| Sample | O₂ % | Time (min) | Power | Base Pressure (Torr) | O₂ Pressure | Ar sccm | Total Pressure | O₂ sccm |
|---|---|---|---|---|---|---|---|---|
| 1 | 10 | 25 | 5 | 1.10E-07 | 1.07 | 183 | 10 | 13 |
| 2 | 6 | 25 | 5 | 4.80E-07 | 0.63 | 185 | 10.01 | 7.3 |
| 3 | 6 | 40 | 5 | 1.80E-07 | 0.62 | 187 | 10 | 6.7 |
| 4 | 3.2 | 35.6 | 5 | 4.20E-07 | 0.32 | 183 | 10.01 | 3.8 |
| 5 | 6 | 25 | 5 | 1.90E-07 | 0.6 | 181 | 10.01 | 6.8 |
| 6 | 6 | 10 | 5 | 4.30E-07 | 0.6 | 178 | 10.01 | 6.8 |
| 7 | 8.8 | 14.4 | 5 | 1.60E-07 | 0.87 | 179 | 10 | 10.5 |
| 8 | 8.8 | 35.6 | 5 | 1.60E-07 | 0.88 | 183 | 10.01 | 10.6 |
| 9 | 2 | 25 | 5 | 1.10E-07 | *0.207 | 184 | 10 | 2.3 |
| 10 | 3.2 | 14.4 | 5 | 3.80E-07 | *0.32 | 180 | 10.01 | 3.5 |

*fluctuating value

The data in Table 1 represents that of an experimental design intended to capture second order polynomial response evenly across a rectangular space generally related to an O₂% of between about 2 to about 10 and a time between about 10 to about 40 minutes for the sputtering of a SiC target. Longer or shorter time intervals can be used, e.g., seconds to hours. The actual settings were not integers because the design was meant to have equal uncertainty in all direction of the O₂ x time space. The test order was randomized.

The thickness of the ten samples as a function of the reactant gas partial pressure, in this case, oxygen and the minutes of sputtering provided the following results, which are summarized in Table 2.

TABLE 2

Exemplary interlayer thickness prepared on composite substrates as a function of time and O₂ partial pressure.

| Sample | Time (min) | O₂ Pressure | Total Pressure | O₂ % | Thickness (nm) Center |
|---|---|---|---|---|---|
| 1 | 25 | 1.07 | 10 | 10.7 | 145 |
| 2 | 25 | 0.63 | 10.01 | 6.3 | 120 |
| 3 | 40 | 0.62 | 10 | 6.2 | 99.4 |
| 4 | 35.6 | 0.32 | 10.01 | 3.2 | 82.9 |
| 5 | 25 | 0.6 | 10.01 | 6.0 | 81.1 |
| 6 | 10 | 0.6 | 10.01 | 6.0 | 46.4 |
| 7 | 14.4 | 0.87 | 10 | 8.7 | 35.8 |
| 8 | 35.6 | 0.88 | 10.01 | 8.8 | 101 |
| 9 | 25 | 0.207 | 10 | 2.1 | 91 |
| 10 | 14.4 | 0.32 | 10.01 | 3.2 | 59.3 |

Samples of interlayer prepared in accordance with the methods disclosed herein were adhesion tested. The interlayer was tested in accordance with ASTM D3359-09, Test B specifically for films less than 50 microns in thickness. The distance between blades was 1 mm, the angle between cross-cuts was 90 degrees, and Intertape© 51596 (polyester/non-woven) was placed parallel to one set of cuts and perpendicular to the other for 90+−30 seconds. For wet adhesion testing, the same test methods were performed after 24+−1 hour of immersion of the substrates in deionized water. Adhesion performance is graded on a scale of 0 to 5, with 0 being observance of a significant removal of the coating, whereas a grade of 5 represents significantly no removal of the coating. The results of the testing for each of Samples 1 through 10 provided a performance grade of 5.

The interlayer was tested for haze change and clarity changes in accordance with ASTM 20-30 or equivalent protocol that conforms to ASTM C 778. Thus, Samples 1 through 10, prepared on clear plastic acrylic substrates were tested and the average % change in measured haze/% change in clarity of the 10 sample substrates determined as follows: 1.8/0.07 and 7.8/0.51 for 100 g and 500 g of abrasive tested, respectively. During the second iteration of the ten samples, where deposition time was doubled for all layers, the % change in haze/% change in clarity was: 0.94/0.03 and 5.9/0.52 for 100 g and 500 g of abrasive, respectively.

Thus, as can be seen from the tables, testing, and accompanying figures, interlayer prepared in accordance with the methods disclosed and described herein provides for an effective, adhesive, abrasion-resistant thin-film coating for a composite substrate, which is suitable for use in subsequent high-energy/high temperature coating processes. The interlayer itself provides excellent adhesion/abrasion resistance to the substrate with improved protection for the underlying composite substrate.

From the foregoing description, various modifications and changes in the compositions and method will occur to those skilled in the art without varying from the scope of the invention as defined in the following claims.

What is claimed:

1. A method comprising the steps of
   (i) depositing, on a carbon fiber reinforced polymer composite substrate, by a chemical and/or physical vapor phase deposition or a plasma-enhanced vapor phase deposition, an interlayer of substantially silicon oxy-carbide, the interlayer having a substrate-proximal layer and a surface-proximal layer, the interlayer having a concentration gradient of carbon and oxygen associated with the silicon oxy-carbide from the substrate-proximal layer and the surface-proximal layer;
   (ii) performing a subsequent kinetic energy coating or a subsequent high temperature coating process on the deposited interlayer of step (i);
   wherein the kinetic energy coating process or the high temperature coating process excludes the chemical and/or vapor phase deposition and the plasma-enhanced vapor deposition of step (i); and
   wherein the kinetic energy coating process or the high temperature coating process is capable of oxidizing organic components of the carbon fiber reinforced polymer composite substrate; and
   (iii) protecting, with the interlayer of (i), the organic components of the carbon fiber reinforced organic polymer composite substrate from oxidation during step (ii).

2. The method of claim 1, wherein the plasma-enhanced vapor phase deposition of step (i) is radio frequency (RF) magnetron sputtering or chemical vapor deposition.

3. The method of claim 1, wherein the carbon fiber reinforced polymer composite substrate comprises epoxy, wherein the epoxy is at least partially protected from oxidizing during the subsequent kinetic energy coating or the subsequent high temperature coating processes of step (ii).

4. The method of claim 1, wherein subsequent kinetic energy coating or subsequent high temperature coating comprises a thermal spray coating process capable of transforming the surface electrical, mechanical and/or thermal properties of the composite material.

* * * * *